US012777708B2

(12) United States Patent
Min et al.

(10) Patent No.: US 12,777,708 B2
(45) Date of Patent: Oct. 27, 2026

(54) SEMICONDUCTOR DEVICE AND METHODS OF FORMING PATTERNS

(71) Applicant: Samsung Electronics Co., Ltd., Suwon-si (KR)

(72) Inventors: Juseong Min, Suwon-si (KR); Jae-Bok Baek, Suwon-si (KR); Taekkyu Yoon, Suwon-si (KR); Seungwook Choi, Suwon-si (KR); Jeehoon Han, Suwon-si (KR); Taeyoon Hong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 611 days.

(21) Appl. No.: 18/318,854

(22) Filed: May 17, 2023

(65) Prior Publication Data

US 2024/0162225 A1 May 16, 2024

(30) Foreign Application Priority Data

Nov. 14, 2022 (KR) ........................ 10-2022-0151861

(51) Int. Cl.

*H10D 84/00* (2025.01)
*H10D 1/47* (2025.01)
*H10P 50/00* (2026.01)
*H10P 50/64* (2026.01)

(52) U.S. Cl.

CPC ............. *H10D 84/209* (2025.01); *H10D 1/47* (2025.01); *H10P 50/642* (2026.01); *H10P 50/691* (2026.01)

(58) Field of Classification Search

CPC ........ H10D 84/209; H10D 1/47; H10D 89/10; H10D 64/517; H01L 21/30604; H01L 21/308; H01L 21/32139; H01L 21/3083

See application file for complete search history.

(56) References Cited

U.S. PATENT DOCUMENTS

| | | | |
|---|---|---|---|
| 7,109,566 | B2 | 9/2006 | Shin |
| 7,186,617 | B2 | 3/2007 | Lee et al. |
| 9,118,002 | B2 | 8/2015 | Seo et al. |
| 9,356,071 | B2 | 5/2016 | Seo et al. |
| 11,322,597 | B2 | 5/2022 | Kodate et al. |
| 2007/0176260 | A1 | 8/2007 | Parekh |
| 2012/0091986 | A1 | 4/2012 | Takemae et al. |
| 2013/0176013 | A1 | 7/2013 | Takemae et al. |
| 2014/0264516 | A1 | 9/2014 | Seo |
| 2015/0325625 | A1 | 11/2015 | Seo |

(Continued)

FOREIGN PATENT DOCUMENTS

| | | | |
|---|---|---|---|
| JP | 2012-084743 | A | 4/2012 |
| KR | 10-2008-0088956 | A | 10/2008 |

(Continued)

*Primary Examiner* — Yara B Green
*Assistant Examiner* — Fakeha Sehar
(74) *Attorney, Agent, or Firm* — HARNESS, DICKEY & PIERCE, P.L.C.

(57) ABSTRACT

A semiconductor device includes an active pattern having sharp corners. The semiconductor device includes a peripheral circuit including a substrate, a resistor device in the substrate, and an active pattern on the substrate. When viewed in a plan view, the active pattern includes corners in a serpentine shape, and first and second shapes of the corners are different from each other.

19 Claims, 22 Drawing Sheets

(56) References Cited

U.S. PATENT DOCUMENTS

| | | | | |
|---|---|---|---|---|
| 2021/0111178 | A1* | 4/2021 | Choi | H10B 12/31 |
| 2022/0149275 | A1 | 5/2022 | Ok et al. | |
| 2023/0299073 | A1* | 9/2023 | Kuo | H10D 30/601<br>257/379 |

FOREIGN PATENT DOCUMENTS

| | | | |
|---|---|---|---|
| KR | 102113802 | B1 | 5/2020 |
| KR | 10-2021-0038734 | A | 4/2021 |

* cited by examiner

SEMICONDUCTOR DEVICE AND METHODS OF FORMING PATTERNS

CROSS-REFERENCE TO RELATED APPLICATIONS

This application claims priority to and the benefit of Korean Patent Application No. 10-2022-0151861 filed in the Korean Intellectual Property Office on Nov. 14, 2022, the entire contents of which are incorporated herein by reference.

BACKGROUND

Various example embodiments relate to a semiconductor device and/or a method of forming patterns in a semiconductor device, and more particularly, to a semiconductor device applied to a peripheral circuit, including an active pattern or a gate pattern that have no or reduced corner rounding, and/or a method of forming patterns.

In a substrate patterning process for forming an active pattern and/or a gate pattern, it is common for corners of the active pattern or gate pattern to be rounded. Corner rounding may cause contact or shorting between adjacent corners. In addition, a size of the active pattern or the gate pattern may be increased by the corner rounding. There may be a need or a desire for improved substrate patterning methods that can eliminate or reduce such corner rounding.

SUMMARY

Some example embodiments provide a semiconductor device including an active pattern and a gate pattern that have corners that are not rounded or reduced, and/or a method of forming patterns.

A semiconductor device according to some example embodiments includes a peripheral circuiting including a resistor device that includes a substrate, and an active pattern on the substrate. When viewed in a plan view, the active pattern includes corners, and the corners have first and second shapes which are different from each other.

Alternatively or additionally, a semiconductor device according to some example embodiments includes a substrate included in a peripheral circuit; an active region on the substrate; a plurality of first gate patterns on the active region; and a second gate pattern on a region out of the active region. When viewed in a plan view, an end cap region of at least one of the plurality of first gate patterns may include a straight line.

Alternatively or additionally, a method of forming patterns according to various example embodiments includes wherein the method includes a first process of placing a first mask pattern on a substrate included in a peripheral circuit, and performing a photo and etching process to form an intermediate pattern on the substrate; and a second process of placing a second mask pattern on the substrate on which the intermediate pattern is formed and performing a photo and etching process to remove at least a portion of the intermediate pattern to form a final pattern. At least some of a plurality of corners of the final pattern may have an angular shape, and/or at least some of the plurality of end cap regions of the final pattern may include straight lines.

According to various example embodiments, an active pattern having angular corners and a gate pattern having a straight-line shaped end cap may be implemented by sequentially performing a processes that include exposure and etching processes twice using masks having different patterns. As such, since the rounding of corners and of end caps of the active pattern and the gate pattern is prevented or reduced in likelihood of occurrence, an increase in the area of the active pattern and the gate pattern and/or contact or shorting between adjacent corners due to the rounding of the corner and the end cap may be prevented or reduced in likelihood of occurrence.

Accordingly, the sizes of the active pattern and the gate pattern may be reduced, and/or electrical shorts between the active patterns and between the gate patterns may be reduced. As a result, a degree of integration and electrical characteristics of semiconductor devices in peripheral circuits may be improved.

Some example embodiments provide a semiconductor device including an active pattern having no or reduced corners and a gate pattern having a straight-line shaped end cap.

Alternatively or additionally, some example embodiments provide a semiconductor device including an active pattern and a gate pattern having improved electrical characteristics.

Alternatively or additionally, some example embodiments provide a semiconductor device including an active pattern and a gate pattern with improved degree of integration.

DETAILED DESCRIPTION

Figure 1:
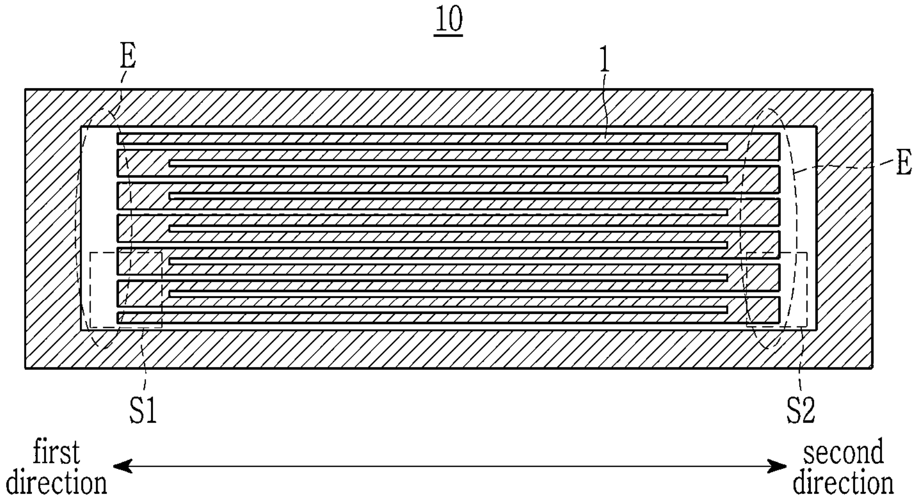
FIG. 1 is a plan view of a resistor pattern constituting a peripheral circuit in a semiconductor device according to various example embodiments.

Various example embodiments will be described more fully hereinafter with reference to the accompanying drawings, in which some example embodiments are shown. The drawings and description are to be regarded as illustrative in nature and not restrictive. Like reference numerals designate like elements throughout the specification. Further, the accompanying drawings are provided in order to allow various example embodiments disclosed to be easily understood by one of ordinary skill in the art, and are not to be interpreted as limiting the spirit disclosed, and it is to be understood that example embodiments includes all modifications, equivalents, and substitutions without departing from the scope and spirit of the present disclosure.

Terms including ordinal numbers such as first, second, and the like will be used only to describe various constituent elements, and are not to be interpreted as limiting these constituent elements. The terms are only used to differentiate one constituent element from other constituent elements.

It is to be understood that when one constituent element is referred to as being "connected" or "coupled" to another constituent element, it may be connected or coupled directly to the other constituent element or may be connected or coupled to the other constituent element with a further constituent element intervening therebetween. In contrast, it should be understood that, when it is described that an element is "directly coupled" or "directly connected" to another element, no element is present between the element and the other element.

Throughout the specification, it should be understood that the term "include," "comprise," or "have" indicates that a feature, a number, a step, an operation, a constituent element, a part, or a combination thereof described in the specification is present, but does not exclude a possibility of presence or addition of one or more other features, numbers, steps, operations, constituent elements, parts, or combinations, in advance. Unless explicitly described to the contrary, the word "comprise" and variations such as "comprises" or "comprising" will be understood to imply the inclusion of stated elements but not the exclusion of any other elements.

When materials, layers (films), regions, pads, electrodes, patterns, structures, or processes are referred to herein as "first," "second," and/or "third," it is not intended to limit such members, rather than merely distinguishing each material, layer (film), region, electrode, pad, pattern, structure, and process. Thus, "first," "second," and/or "third" may be used selectively or interchangeably with respect to each material, layer (film), region, electrode, pad, pattern, structure, and process, respectively.

As used herein, the term "end cap" refers to a single unbranched line connecting both corners constituting the end of a gate pattern, which may be a straight line or a curved line, and both straight and curved lines.

FIGS. 1 to 22 are plan views and schematic views illustrating a semiconductor device and a method of forming patterns in the semiconductor device according to example embodiments. FIGS. 1 to 5, FIGS. 10 to 17, FIG. 19, FIG. 21, and FIG. 22 are plan views, FIGS. 6 and 7 are schematic views showing angles and rounding indices of pattern corners, and FIGS. 8, 9, and 18 and 20 are schematic views of the processes.

Figure 2:
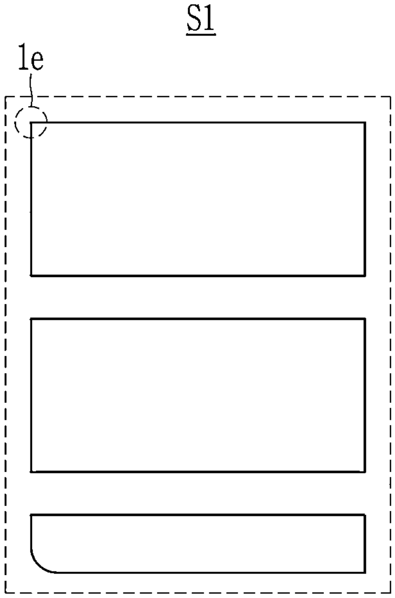
FIG. 2 is an enlarged plan view of the S1 region of FIG. 1.
Figure 3:
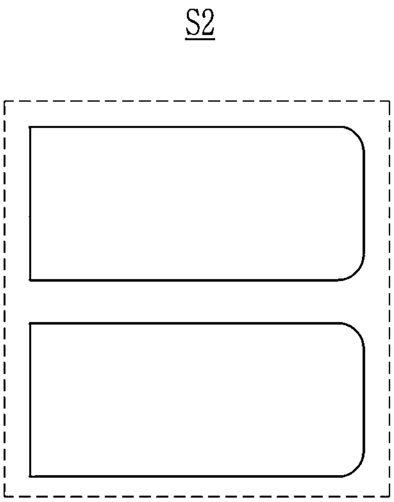
FIG. 3 is an enlarged plan view of the S2 region of FIGS. 1 and 4.
Figure 4:
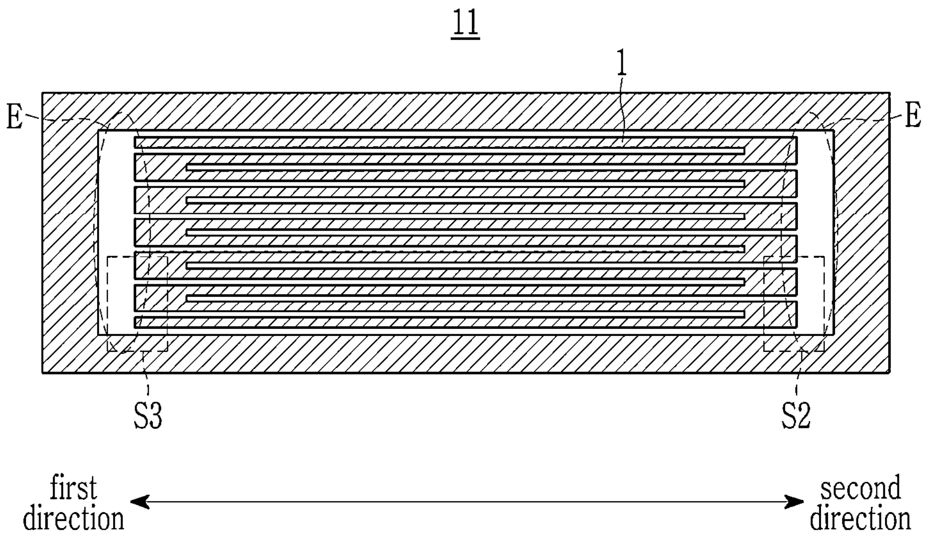
FIG. 4 is a plan view of a resistor pattern constituting a peripheral circuit in a conventional semiconductor device.
Figure 5:
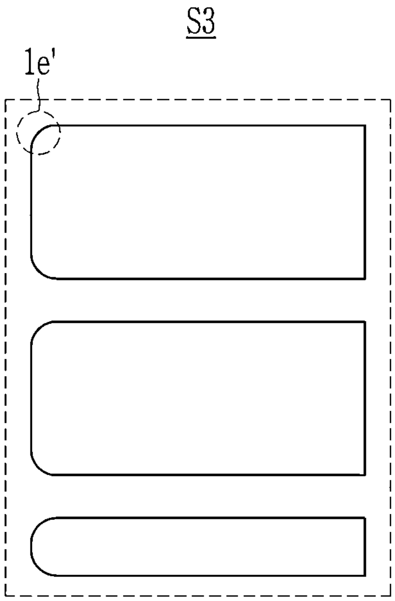
FIG. 5 is an enlarged plan view of an S3 region of FIG. 1.
Figure 6:
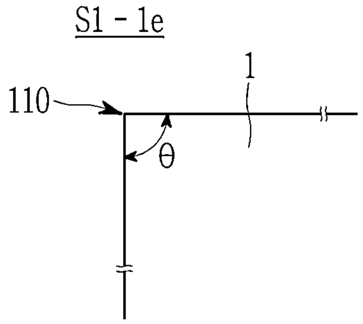
FIG. 6 is an enlarged plan view of a corner 1*e* of the S1 region of FIG. 2.
Figure 7:
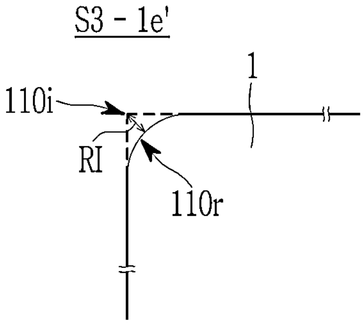
FIG. 7 is an enlarged plan view of a corner 1*e* of the S3 region of FIG. 5.
Figure 8:
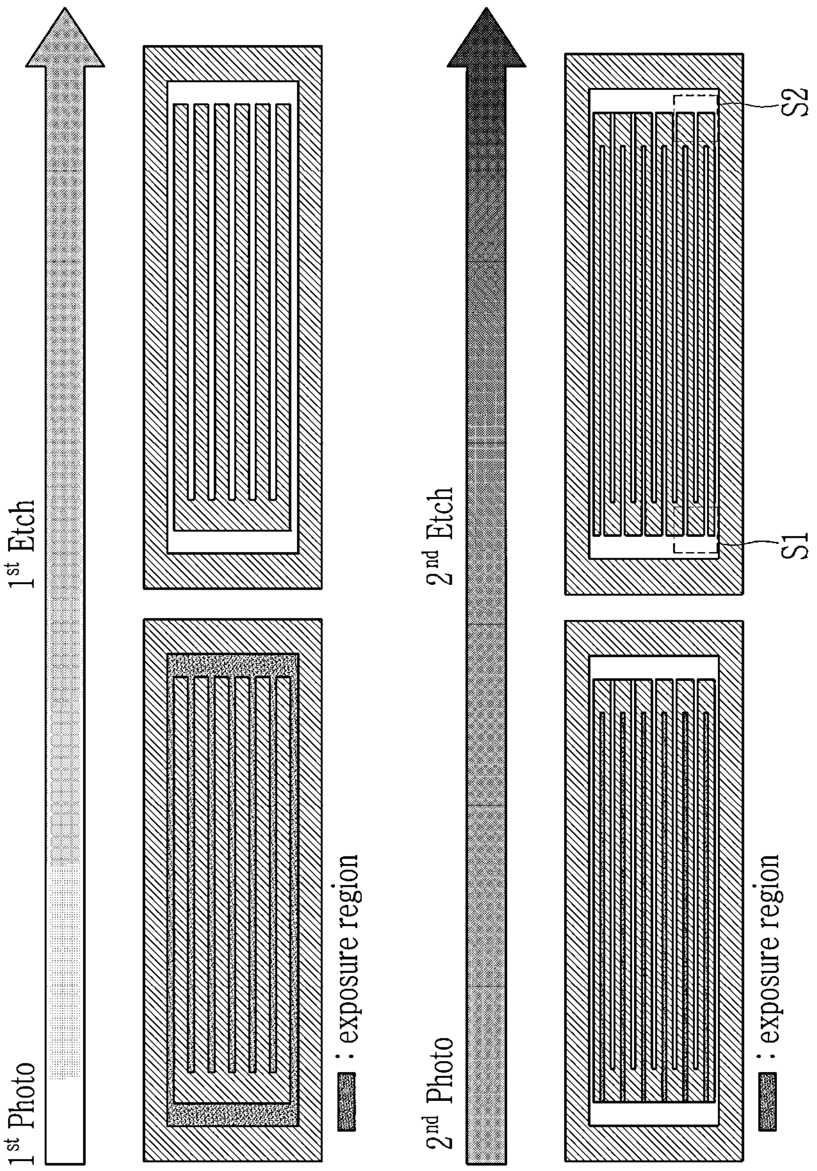
FIG. 8 illustrates continuously performing an exposure process and an etching process twice in a method of forming a resistor pattern constituting a peripheral circuit in a semiconductor device according to various example embodiments.
Figure 10:
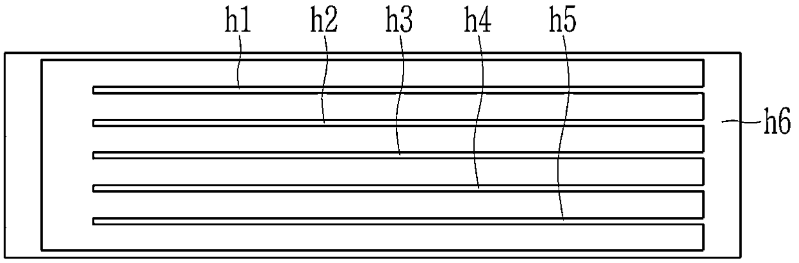
FIG. 10 illustrates a mask pattern used in a first exposure process in a method of forming a resistor pattern constituting a peripheral circuit in a semiconductor device according to various example embodiments.
Figure 11:
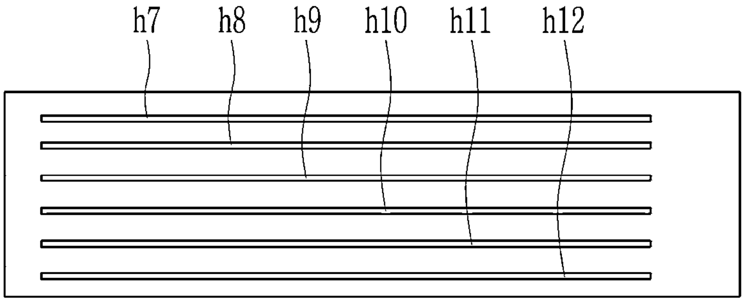
FIG. 11 illustrates a mask pattern used in a second exposure process in a method of forming a resistor pattern constituting a peripheral circuit in a semiconductor device according to various example embodiments.
Figure 12:
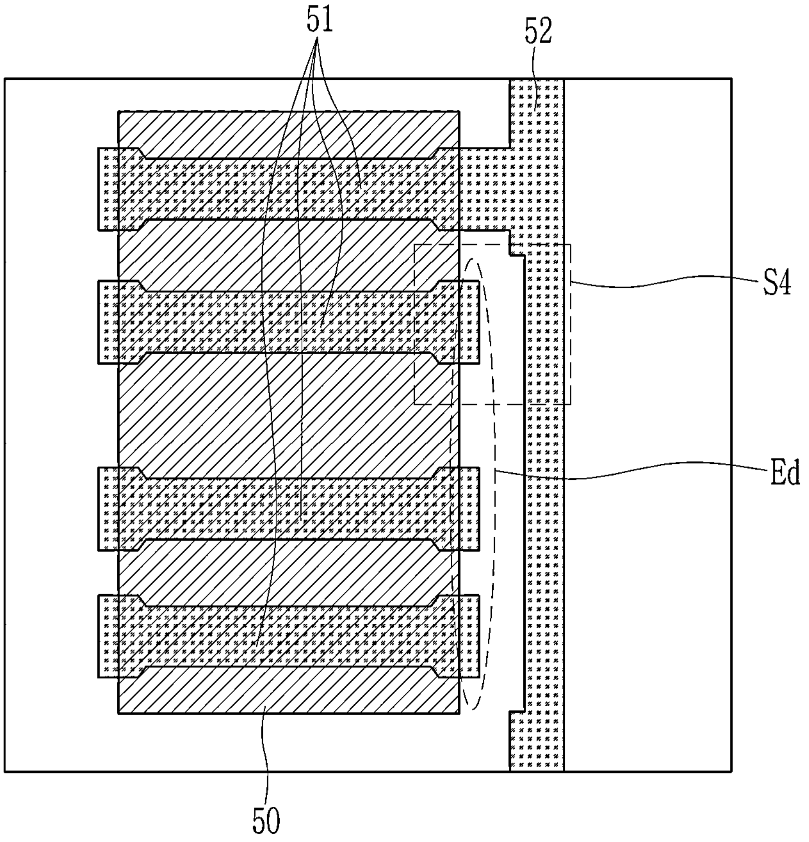
FIG. 12 is a plan view of a gate pattern on an active region constituting a peripheral circuit in a semiconductor device and a gate pattern out of the active region according to various example embodiments.
Figure 13:
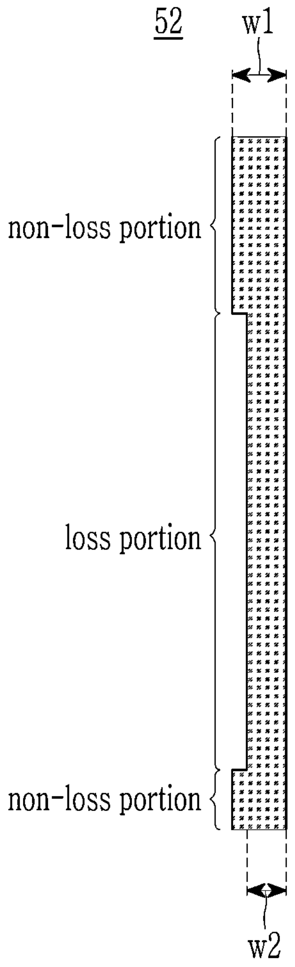
FIG. 13 is a plan view of a gate pattern out of an active region constituting a peripheral circuit in a semiconductor device according to various example embodiments, showing that the gate pattern has a loss portion and a non-loss portion.
Figure 14:
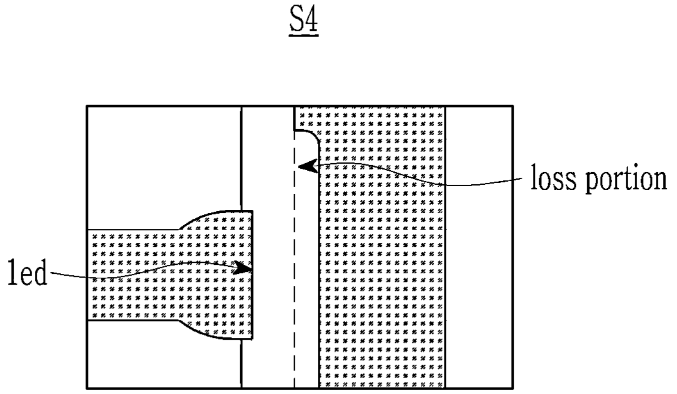
FIG. 14 is an enlarged plan view of the S4 region of FIG. 12.
Figure 15:
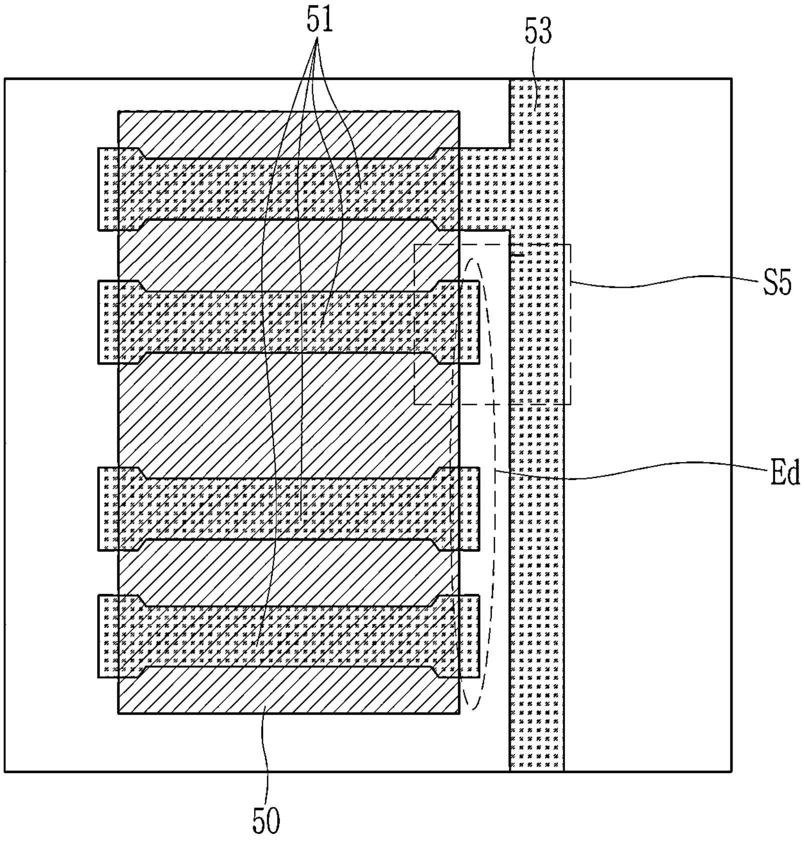
FIG. 15 is a plan view of a gate pattern on an active region constituting a peripheral circuit in a conventional semiconductor device and a gate pattern out of the active region.
Figure 16:
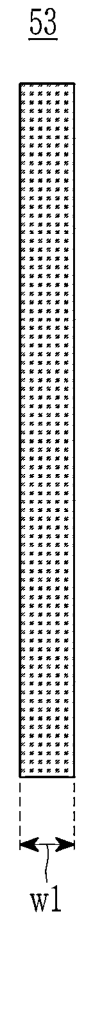
FIG. 16 is a plan view of a gate pattern out of an active region constituting a peripheral circuit in a conventional semiconductor device, showing that the gate pattern does not have a loss portion.
Figure 17:
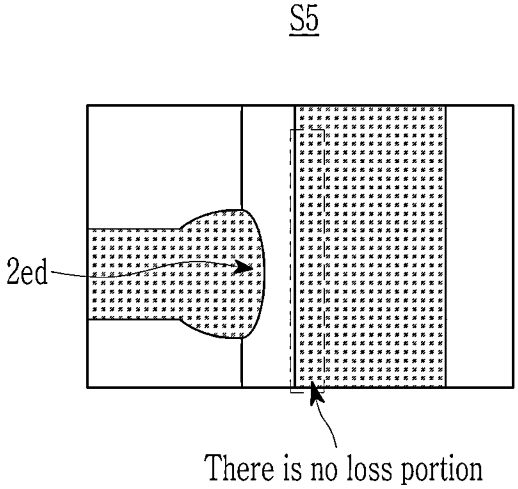
FIG. 17 is an enlarged plan view of the S5 region of FIG. 15.
Figure 18:
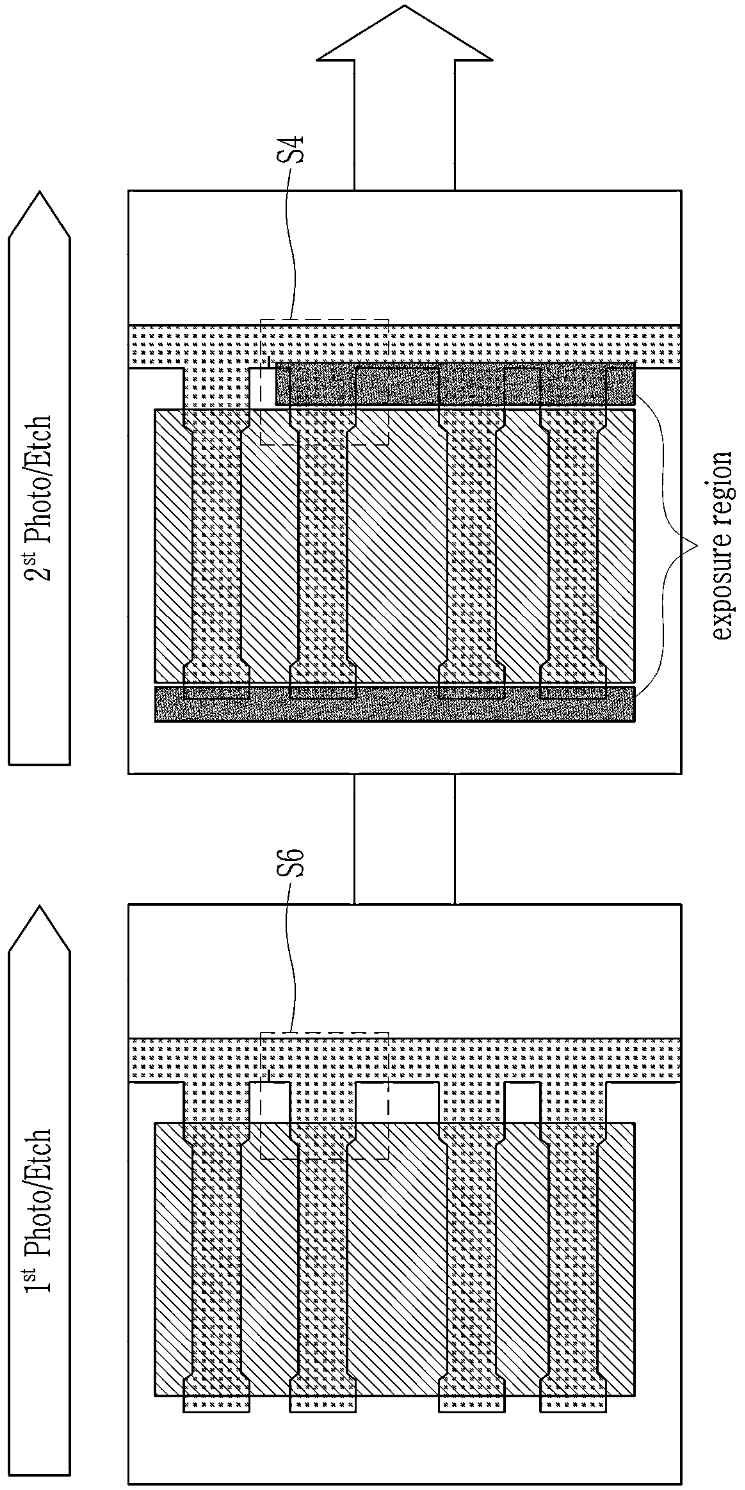
FIG. 18 illustrates continuously performing an exposure process and an etching process twice in a method of forming a gate pattern on an active region constituting a peripheral circuit in a semiconductor device and a gate pattern out of the active region according to various example embodiments.

FIG. 2 is an enlarged plan view of the S1 region of FIG. 1, FIG. 3 is an enlarged plan view of the S2 region of FIGS. 1 and 4, FIG. 5 is an enlarged plan view of the S3 region of FIG. 4, FIG. 6 is an enlarged plan view of a corner 1*e* portion of the S1 region of FIG. 2, FIG. 7 is an enlarged plan view of a corner 1*e* portion of the 51 region of FIG. 5, FIG. 13 is an enlarged plan view of the gate pattern 52 of FIG. 12, FIG. 14 is an enlarged plan view of the S4 region of FIG. 12, FIG. 16 is an enlarged plan view of the gate pattern 53 of FIG. 15, FIG. 17 is an enlarged plan view of the S5 region of FIG. 15, and FIGS. 10, 11, 21, and 22 are plan views of a mask having a pattern including a plurality of openings h1 to h19. FIGS. 8 and 18 show each step of continuously performing exposure and etching processes twice in a method of forming patterns in a semiconductor device.

Hereinafter, a patterning method (e.g. a method of forming patterns) capable of realizing an active pattern with no or reduced corner rounding and/or a gate pattern with a straight-line shaped end cap according to various example embodiments and a semiconductor device including the corresponding patterns will be described in detail with reference to the accompanying drawings.

Referring to FIG. 1, among a cell circuit and a peripheral circuit that constitute or are included in a semiconductor device, a resistor device 10 constituting or included in the peripheral circuit may include a substrate included in the peripheral circuit and an active pattern 1 provided on the substrate, wherein the active pattern may include corners E on both sides (e.g. both left and right sides) when viewed in a plan view. Herein, both a first corner (e.g. a left corner) and a second corner (e.g., a right corner) may have different pattern shapes S1 and S2.

In some example embodiments, the resistor device may have a snake-like or serpentine structure, with corners corresponding to the turns of the serpentine structure. In some example embodiments, the serpentine structure may be or may include a portion of the substrate that is implanted with or includes dopants having a particular resistance per square. In some example embodiments, the serpentine structure may be surrounded by an insulating material such as an oxide insulating material, such as but not limited to a shallow trench isolation (STI) oxide and/or a locally oxidized silicon (LOCOS); example embodiments are not limited thereto.

Specifically, the substrate may be or may include a chip or a wafer including a semiconductor material such as one or more of silicon, germanium, silicon-germanium, or GaP, GaAs, GaSb, and the like, for example, Group III to V compounds. According to some example embodiments, the substrate may be or may include a Silicon On insulator (SOI) wafer or a Germanium On Insulator (GOI) wafer. For another example, an etch target layer such as a conductive layer, an insulation layer, or a combination thereof may be provided instead of or in addition to or on the substrate.

Referring to FIG. 1, when viewed in a plan view, the corners (E) of the active pattern 1 may consist of or may include corners in a first direction or first position and corners in a second direction or second position that is parallel to the first direction and facing opposite to the first direction. Herein, the first direction refers to one direction toward the active pattern having corners based on an arbitrary pattern having no corners in the plan view of the active pattern, and the second direction refers to the opposite direction parallel to the first direction. In some example embodiments, the first direction may extends antiparallel to or opposite to the second direction. For example, when the first direction and the second direction are placed on the same line, the second direction may have an angle of about 180° with the first direction.

Referring to FIGS. 2 and 3, the corners in the first direction may have both rounded and angular shapes, and the corners in the second direction all may have rounded shapes.

Specifically, referring to FIGS. 2 and 6, corners with the angular shape (sharp corners) 1*e* may have a corner angle of about 90° or similar. For example, a corner 1*e* may have a sharp tip 110. The corner 1*e* may have a rounding index of about 0 or almost about 0, wherein the rounding index will be described later, referring to FIG. 7. This description may also be applied to the other corners of the active pattern 1.

Referring to FIG. 2, the corner 1*e* of the active pattern 1 may not be rounded, but one or more of the other corners of the active pattern 1 may be rounded. In some example embodiments, when viewed in a plan view, a lowermost corner and/or an uppermost corner among the corners in the first direction of the active pattern 1 may have a rounded shape respectively, and all corners between the lowermost corner and the uppermost corner among the corners in the first direction may have angular shapes alone.

Referring to FIG. 7, a rounding degree of the corners may be expressed by a rounding index (RI). The rounding index (RI) may indicate a distance between a rounded tip 110*r* and a virtual tip 110*i*, for example, the shortest or smallest distance therebetween. The virtual tip 110*i* may be located at a point where the tip or apex would exist, unless the corner 1*e*' is rounded. For example, the virtual tip 110*i* at the corner 1*e* of the active pattern 1 may correspond to the tip 110 of FIG. 6. Herein, the corner 1*e* may have a rounding index (RI) of less than or equal to about 5 nm. For example, the rounding index (RI) may be about 0 nm to about 3 nm, about 0 nm to about 2 nm, about 0 nm to about 1 nm, or about 0 nm. This may be equally applied to all of or at least some of the corners located between the lowermost corner and the uppermost corner of the corners in the first direction. In some example embodiments, the rounding index (RI) may be related to a radius of curvature of the rounded tip 110*r*. For example, in some example embodiments, the (radius of curvature of the rounded tip 110*r*) plus (the rounding index (RI)) may be equal to (1.414 times the radius of curvature of the rounded tip 110*r*).

On the contrary, the lowermost corner and the uppermost corner of the corners in the first direction may have a rounding index (RI) of greater than or equal to about 20 nm. For example, the rounding index (RI) may be about 20 nm to about 50 nm, about 25 nm to about 45 nm, or about 30 nm to about 40 nm but may be larger than these. This may be equally applied to both the lowermost corner and the uppermost corner of the corners in the first direction and to all of the corners in the second direction.

As such, according to various example embodiments, the corner 1*e* of the active pattern 1 may have the sharp tip 110, as shown in FIG. 6, or the rounded tip 110*r*, as shown in FIG. 7. Even though the corner 1*e* has the rounded tip 110*r*, the rounding index (RI) may be less than or equal to about 3 nm; for example, the rounding degree is reduced, which may solve or help to solve or mitigate problems caused by corner rounding, as described below.

Unlike example embodiments, when a pattern is formed through a single patterning (exposure/etching) process, as shown in FIG. 4, the pattern may all have round corners. Herein, the rounding degree may be large enough to have a rounding index of greater than or equal to about 20 nm. For example, as shown in FIGS. 3, 5, and 7, the active pattern 1 having round corners may be formed.

In the active pattern according to a comparative embodiment, the corners E may be extended by rounding the corners 1*e*' and thus have a relatively large length, compared with that of the active pattern 1 of various example embodiments. This increased length of the active pattern may cause an increase in an area of the active pattern, which may inhibit improvement of integration of a semiconductor device. Alternatively or additionally, the extension of the corners of the active pattern may make adjacent corners of the active pattern and corners of adjacent active patterns directly contact each other, e.g. short each other, and thus deteriorate electrical characteristics of the semiconductor device.

On the contrary, various example embodiment may help prevent or reduce the amount and/or likelihood of length increase and/or the contact or shorting of the corners of the active pattern as compared with other comparative examples. As a result, a semiconductor device including the active pattern 1 having angular corners (sharp corners) 1*e* may achieve increased integration and improved electrical characteristics.

In general, an active pattern may have various shapes. For example, the active pattern may include at least one active pattern having a rectangular or similar shape, at least one active pattern having a dumbbell or dog boned or similar shape, at least one active pattern having a comb or similar shape, and at least one active pattern having a square or similar shape. However, the active pattern 1 of various example embodiments may have a serpentine or snake-like shape. The serpentine-shaped pattern may indicate a single line connecting two points, which excludes a straight light connecting the two points with a shortest distance. For example, a serpentine-shaped pattern may be a single line connecting the two points without branching and include several lines excluding a straight line that directly connects the two points. For example, the serpentine-shaped pattern may be a single line extending in multiple directions but not branching into other lines. FIG. 1 shows the serpentine-shaped pattern, which is provided as an example for better understanding and ease of description, but example embodiments are not limited thereto.

FIGS. 12 to 14 are plan views of a gate pattern on an active region constituting a peripheral circuit in a semiconductor device and a gate pattern out of the active region according to example embodiments.

Referring to FIG. 12, a semiconductor device includes: a substrate included in a peripheral circuit and a peripheral circuit constituting the semiconductor device; an active region 50 on the substrate; a plurality of first gate patterns 51 on the active region; and a second gate pattern 52 on a region outside of the active region.

For example, when viewed in a plan view, the plurality of first gate patterns 51 are located on the active region 50, wherein an end cap region Ed of at least one thereof may include a straight line, and the second gate pattern 52 may be located on a region outside of the active region 50, e.g., over an isolation region.

The substrate may be as described above.

Referring to FIG. 12, when viewed in a plan view, the plurality of first gate patterns 51 may extend in a direction perpendicular to an extending direction of the second gate pattern 52. Specifically, when viewed in a plan view, at least one of the plurality of first gate patterns 51 may be connected to the second gate pattern 52, For example, the uppermost first gate pattern among the plurality of first gate patterns 51 may be connected to the second gate pattern 52 in the perpendicular direction thereto.

FIG. 14 is an enlarged plan view of the S4 region of FIG. 12. Referring to FIG. 14, when viewed in a plan view, a straight line 1*ed* in the end cap region Ed of the first gate patterns 51 may face the second gate pattern 52 in parallel. Since the end cap region Ed of the first gate patterns 51 includes the straight line led and may eliminate or reduce the end cap rounding effect, as described above, a semiconductor device including the patterns may obtain increased integration and/or improved electrical characteristics, e.g. by reducing a corner rounding effect and reducing the likelihood of a short between the first gate patterns 51 and the second gate pattern 52.

Referring to FIG. 13, when viewed in a plan view, the second gate pattern 52 according to various example embodiments may include a loss portion and a non-loss portion. Herein, the loss portion may face the straight line 1*ed* in the end cap region Ed of the first gate patterns 51 and have a narrower width w2 than a width w1 of the non-loss portion. The shape of the second gate pattern 52 may increase a distance from the end cap region Ed of the first gate patterns 51 having the straight line 1*ed*, thereby preventing or reducing the likelihood of direct contact or shorting of adjacent patterns in advance and thus not deteriorating the electrical characteristics of the semiconductor device. The loss portion may be or correspond to a region removed by a photo/etching process or a region including the same, and the non-loss portion may have no region removed by the photo/etching process.

Unlike various example embodiments, when a gate pattern is formed through a single patterning (exposure/etching) process, as shown in FIG. 15, the end cap region Ed of the formed first gate patterns 51 may be all rounded 2*ed*. For example, as shown in FIG. 17, the first gate patterns 51 having a rounded end cap region may be formed.

FIG. 17 is an enlarged plan view of the S5 region of FIG. 15. Referring to FIG. 17, when viewed in a plan view, since the end cap region Ed of the first gate patterns 51 is not straight but round 2*ed*, the end cap region Ed may not naturally face the second gate pattern 53 in parallel. Since the end cap region Ed of the first gate patterns 51 includes the curved line 2*ed*, a conventional semiconductor device including the patterns may have a problem in integration, which inevitably leads to deterioration of electrical characteristics.

Referring to FIG. 16, when viewed in a plan view, the second gate pattern 53 according to comparative embodiments may not include the loss portion. Referring to FIG. 17, the second gate pattern 53 has no lost region. Accordingly, since the distance with the curved line 2*ed* in the end cap region Ed of the first gate patterns 51 becomes narrow, adjacent patterns may inadvertently directly contact each other, deteriorating electrical characteristics of a semiconductor device.

On the contrary, various example embodiments may prevent or reduce the likelihood of contact between the first and second gate patterns by increasing the length between the first and second gate patterns in the comparative embodiments. As a result, a semiconductor device including the first gate patterns 51 having the end cap region including the straight line and the second gate pattern 52 having the loss portion may achieve increased integration and/or improved electrical characteristics.

FIGS. 8 and 18 are plan views illustrating methods of forming patterns according to embodiments of the present disclosure.

Referring to FIG. 8, a method of forming patterns according to example embodiments includes a first process of placing a first mask pattern on a substrate included in a peripheral circuit and performing a photo and etching process to form an intermediate pattern on the substrate; and a second process of placing a second mask pattern on the substrate on which the intermediate pattern is formed and performing a photo and etching process to remove at least a portion of the intermediate pattern to form a final pattern. At least a portion of the plurality of corners of the final pattern may have an angular shape.

Referring to FIG. 18, a method of forming patterns according to various example embodiments includes a first process of placing a first mask pattern on a substrate included in a peripheral circuit and performing a photo and etching process to form an intermediate pattern on the substrate; and a second process of placing a second mask pattern on the substrate on which the intermediate pattern is formed and performing a photo and etching process to remove at least a portion of the intermediate pattern to form a final pattern, wherein at least a portion of the end cap region of the final pattern may include a straight line.

The photo process may mean or refer to a process all including coating a photoresist, exposing after the coating, and developing after the exposure.

Herein, after the first process, the second process may be sequentially performed.

Figure 21:
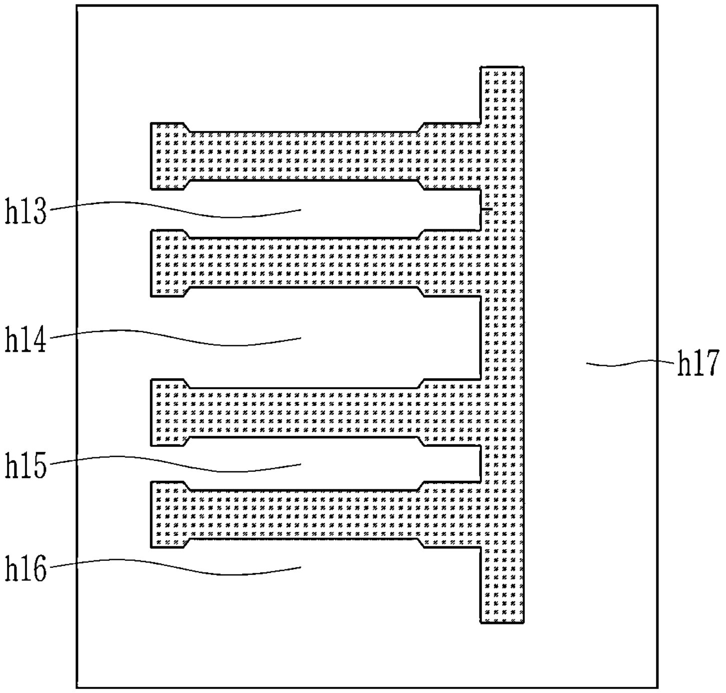
FIG. 21 illustrates a mask pattern used in a first exposure process of a method of forming a gate pattern on an active region constituting a peripheral circuit in a semiconductor device and a gate pattern out of the active region according to various example embodiments.
Figure 22:
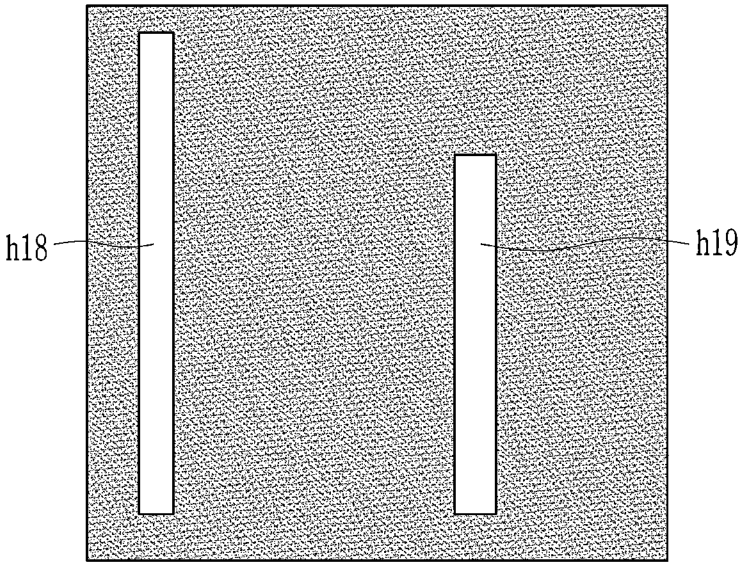
FIG. 22 illustrates a mask pattern used in a second exposure process in a method of forming a gate pattern on an active region constituting a peripheral circuit in a semiconductor device and a gate pattern out of the active region according to various example embodiments.

FIGS. 10 and 21 show a first mask pattern used in the first process, and FIGS. 11 and 22 show a second mask pattern used in the second process.

Referring to FIGS. 10 and 21, a first mask used to place the first mask pattern in the first process may include a plurality of openings h1 to h6 and h13 to h17, wherein the plurality of openings h1 to h6 and h13 to h17 are connected to each other. During the exposure, the plurality of openings h1 to h6 and h13 to h17 may be exposed.

Referring to FIGS. 11 and 22, a second mask used forming the second mask pattern in the second process includes a plurality of openings h7 to h12 and h18 and h19, wherein the plurality of openings h7 to h12 and h18 and h19 may be spaced apart from each other, e.g. by the same amount as the spacings of openings h1 to h5. During the exposure, the plurality of openings h7 to h12 and h18 and h19 are exposed.

The openings h1 to h19 respectively may have various shapes such as one or more of a quadrangle, or a quadrangle shape a circle, an oval, a polygon, or the like exposing a portion of the mask according to various example embodiments.

Figure 19:
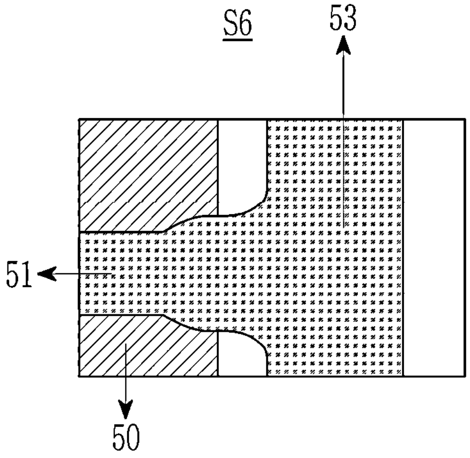
FIG. 19 is an enlarged plan view of the S6 region of FIG. 18.

Referring to FIGS. 8 and 19, after the first process, an active pattern having a comb or similar shape and a connected shape to each other is formed, and in addition, the first gate patterns 51 on the active region 50 and the second gate pattern 52 on a region out of the active region 50 are patterned in the connected shape to each other. In this way, after the first process, when the patterns all are patterned in the connected shape, the rounding phenomenon may be more easily removed by the second process subsequently performed thereafter.

For example, when the first mask used in the first process include the plurality of openings h1 to h6 and h13 to h17 connected each other, after the first process is completed, the active pattern and/or the gate patterns all are patterned in the connected shape, and the second process subsequently performed thereafter may use a second mask including the plurality of openings h7 to h12 and h18 and h19 spaced apart each other for exposure and etching, resulting in more easily removing the pattern corner rounding and the pattern end cap rounding.

Referring to FIG. 11, the plurality of openings h7 to h12 of the second mask pattern may have the same shape. The second mask pattern may be configured in this way to easily pattern the active pattern all connected after the first process to have different right (first) and left (second) shapes, for example, the corners in the first direction have rounded and angular shapes, while the corners in the second direction all have rounded shapes alone.

Referring to FIG. 22, the plurality of openings h18 and h19 of the second mask pattern may have a different shape. The second mask pattern may be configured in this way to disconnect the gate pattern all having a connected shape after the first process so that the end cap region Ed of the first gate patterns 51 may have the straight line led to increase a length between the straight line led of the end cap region Ed and the second gate patterns 5 and thus prevent or reduce the likelihood of the contact of the patterns by losing a portion of the second gate pattern 52 perpendicularly facing the first gate pattern 51.

Figure 9:
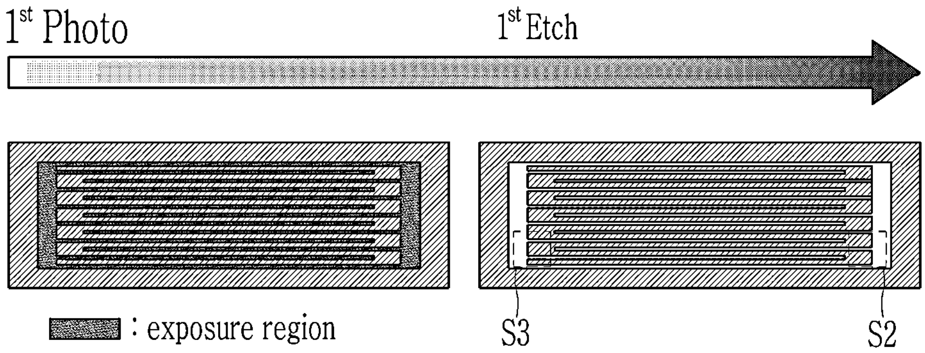
FIG. 9 illustrates performing an exposure process and an etching process only once in a conventional method of forming a resistor pattern constituting a peripheral circuit in a semiconductor device.
Figure 20:
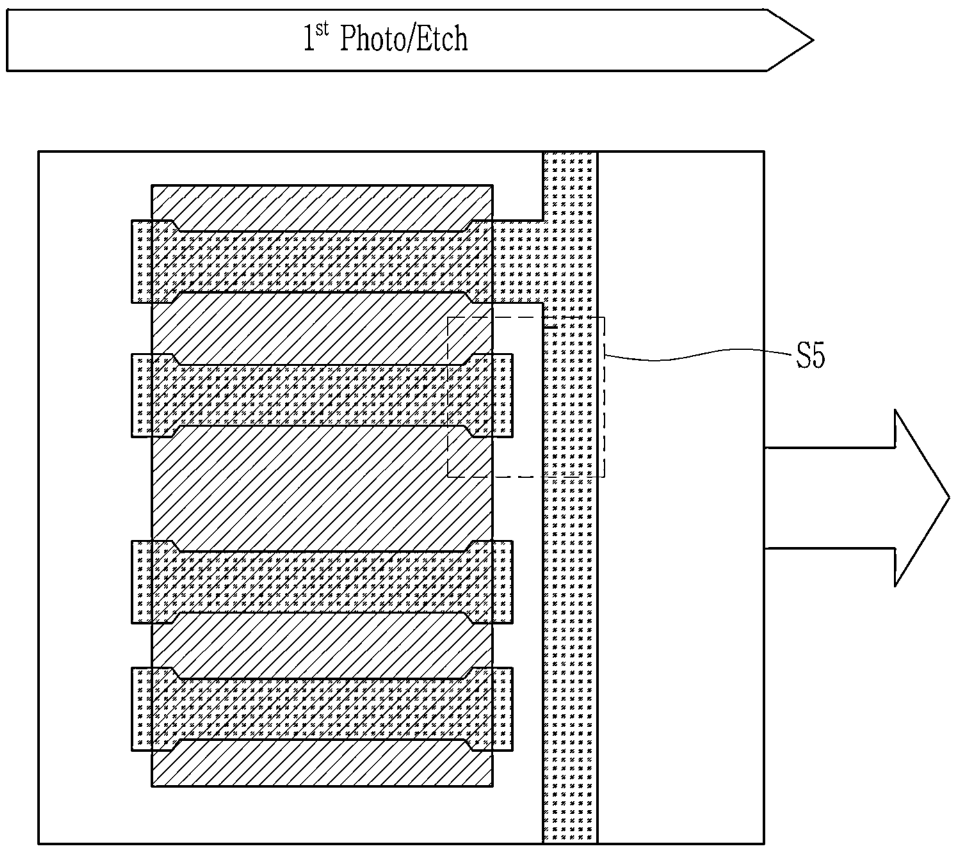
FIG. 20 illustrates performing an exposure process and an etching process only once in a method of forming a gate pattern on an active region constituting a peripheral circuit in a conventional semiconductor device and a gate pattern out of the active region.

Conventionally, as shown in FIG. 9, the serpentine-shaped active pattern is realized through a single exposure/etching process, or as shown in FIG. 20, and the first gate patterns 51 and the second gate pattern 53 are disconnected through the single exposure/etching process, wherein the final patterning through the single exposure/etching process cannot but accompany the side effects due to the rounding phenomenon.

However, according to various example embodiments, two exposure/etching processes are continuously performed by using different pattern masks in each process to remove the rounding phenomenon, easily forming a desired pattern.

The exposure may be performed by using a laser light source such as an argon fluoride (ArF) light source and/or a krypton fluoride (KrF) light source. Compared with a light source such as EUV, more detailed patterning may be achieved, but such a light source may have a high cost. However, example embodiments may use an ArF light source and/or a KrF light source, which does not have a high cost, and the ArF light source or the KrF light source may realize more detailed patterning as opposed to an EUV light source is used.

According to various example embodiments, the active pattern 1 may have no corner rounding or reduced sharp corners. Alternatively or additionally, the end cap in the gate pattern may have a straight-line shape, and another gate pattern facing this has a loss portion and thus may increase a length between both of them. Therefore, the patterns may be prevented or reduced from a size increase and a contact among adjacent corners/patterns according to the corner rounding or the end cap rounding. Accordingly, it may be possible to increase integration of the active pattern, prevent or reduce the likelihood of direct contact or shorting between the gate patterns, and/or improve electrical characteristics of a semiconductor device.

When the terms “about” or “substantially” are used in this specification in connection with a numerical value, it is intended that the associated numerical value includes a manufacturing or operational tolerance (e.g., ±10%) around the stated numerical value. Moreover, when the words “generally” and “substantially” are used in connection with geometric shapes, it is intended that precision of the geometric shape is not required but that latitude for the shape is within the scope of the disclosure. Moreover, when the words “generally” and “substantially” are used in connection with material composition, it is intended that exactitude of the material is not required but that latitude for the material is within the scope of the disclosure.

Further, regardless of whether numerical values or shapes are modified as “about” or “substantially,” it will be understood that these values and shapes should be construed as including a manufacturing or operational tolerance (e.g., ±10%) around the stated numerical values or shapes. Thus, while the term “same,” “identical,” or “equal” is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

While various features have been described in connection with what is considered to be practical example embodiments, it is to be understood that inventive concepts are not limited to the disclosed embodiments, but, on the contrary, is intended to cover various modifications and equivalent arrangements included within the spirit and scope of the appended claims. Furthermore, example embodiments are not necessarily mutually exclusive with one another. For example, some example embodiments may include one or more features described with reference to one or more drawings, and may also include one or more other features described with reference to one or more other drawings.

What is claimed is:

1. A semiconductor device:

a peripheral circuit including a substrate; and an active pattern on the substrate, wherein when viewed in a plan view, the active pattern includes corners in a first direction and corners in a second direction opposite to the first direction, at least some of the corners in the first direction have different shapes from at least some of the corners in the second direction, wherein a middle one of the at least some of the corners in the first direction has a rounding index of less than or equal to 5 nm, and a lowermost one of the at least some of the corners in the first direction have a rounding index of greater than or equal to 20 nm.

2. The semiconductor device of claim 1, wherein when viewed in a plan view, a plurality of the corners in the first direction have an angular shape having a rounding index of less than or equal to 5 nm, and all corners in the second direction have rounded shapes having a rounding index of greater than or equal to 20 nm.

3. The semiconductor device of claim 2, wherein when viewed in a plan view, an uppermost one among the corners in the first direction have a rounded shape.

4. The semiconductor device of claim 3, wherein when viewed in a plan view, all corners between the lowermost corner and the uppermost corner among the corners in the first direction have angular shapes having a rounding index of less than or equal to 5 nm.

5. The semiconductor device of claim 2, wherein all of the corners having the angular shapes have a corner angle of 90°.

6. The semiconductor device of claim 2, wherein each of the corners having the angular shapes has a rounding index of 0 nm, the rounding index being a distance between a corner tip when the corner is not rounded and a corner tip when the corner is rounded.

7. The semiconductor device of claim 1, wherein the active pattern has a serpentine shape.

8. The semiconductor device of claim 1, wherein a middle one of the at least some of the corners in the second direction has a rounding index of greater than 20 nm.

9. The semiconductor device of claim 1, wherein the rounding index of the middle one of the at least some of the corners has a rounding index of between 0 nm and 3 nm.

10. The semiconductor device of claim 1, wherein the rounding index of the middle one of the at least some of the corners has a rounding index of between 0 nm and 2 nm.

11. The semiconductor device of claim 1, wherein the rounding index of the middle one of the at least some of the corners has a rounding index of between 0 nm and 1 nm.

12. The semiconductor device of claim 1, wherein a rounding index of all corners in the second direction is greater than or equal to 20 nm.

13. The semiconductor device of claim 1, wherein the rounding index of all corners in the second direction is greater than or equal to 25 nm.

14. The semiconductor device of claim 1, wherein the rounding index of all corners in the second direction is greater than or equal to 30 nm.

15. The semiconductor device of claim 1, wherein the active pattern is a single line connecting two points, without branching.

16. The semiconductor device of claim 1, wherein the active pattern is a resistor.

17. The semiconductor device of claim 1, wherein the active pattern includes dopants.

18. The semiconductor device of claim 1, wherein the first direction is antiparallel with the second direction.

19. The semiconductor device of claim 1, wherein the active pattern is surrounded by a shallow trench isolation oxide.

* * * * *